United States Patent
Wong et al.

(10) Patent No.: US 7,745,095 B2
(45) Date of Patent: Jun. 29, 2010

(54) LITHOGRAPHIC METHOD AND DEVICE MANUFACTURED THEREBY

(75) Inventors: Patrick Wong, Schilde (BE); Wendy Fransisca Johanna Gehoel Van Ansem, Westerhoven (NL); Rudolf Adrianus Joannes Maas, Eindhoven (NL); Suping Wang, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 392 days.

(21) Appl. No.: 11/822,429

(22) Filed: Jul. 5, 2007

(65) Prior Publication Data
US 2009/0011369 A1 Jan. 8, 2009

(51) Int. Cl.
*G03F 7/00* (2006.01)
*G03F 7/16* (2006.01)
*G03F 7/38* (2006.01)

(52) U.S. Cl. .............. 430/270.1; 430/273.1; 430/331; 430/396

(58) Field of Classification Search ............ 430/270.1, 430/273.1, 331, 396
See application file for complete search history.

(56) References Cited

U.S. PATENT DOCUMENTS 7,354,693 B2 * 4/2008 Hatakeyama et al. .... 430/270.1
2004/0224516 A1 * 11/2004 Peterson et al. ............ 438/689

\* cited by examiner

*Primary Examiner*—Amanda C. Walke
(74) *Attorney, Agent, or Firm*—Pillsbury Winthrop Shaw Pittman, LLP

(57) ABSTRACT

A substrate processing method of a substrate provided with an anti-reflective coating which extends to or beyond a peripheral edge of the substrate is disclosed. The method includes removing a portion of the anti-reflective coating adjacent to and around a periphery of the substrate using a back-side removal process, depositing a layer of radiation sensitive material onto the anti-reflective coating, depositing a top-coat layer onto the layer of radiation sensitive material, and simultaneously removing a portion of the layer of radiation sensitive material and a portion of the top-coat layer from around an area adjacent to the periphery of the substrate using a top-side removal process.

22 Claims, 5 Drawing Sheets

LITHOGRAPHIC METHOD AND DEVICE MANUFACTURED THEREBY

FIELD

The present invention relates to a lithographic method and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

A layer of resist (or other material) is often provided on the surface of a substrate using a spin-coating process. The material used to form the layer is dropped onto the center of the substrate, and the substrate is then rotated. The material flows out towards the edge of the substrate and provides a layer of generally uniform thickness across the surface of the substrate. During the spin-coating process, a thick bead of material is known to form around the edge of the substrate. This bead around the edge of the substrate is commonly referred to as an edge bead. It is desirable to remove this edge bead for a number of reasons. Firstly, it may be difficult or impossible to apply a uniform pattern to, for example, resist forming the edge bead since it is of a greater thickness than resist towards the center of the substrate. Furthermore or alternatively, material forming the edge bead may break off and contaminate the substrate or parts of the lithographic apparatus.

SUMMARY

The problem of contamination may be even more prevalent when an immersion fluid is used between the substrate and, for example, a projection lens, to improve a numerical aperture of the lithographic apparatus and method. The immersion fluid and a device used to contain the immersion fluid may exert a pressure on the substrate. This pressure increases the risk of material forming the edge bead being removed from the substrate and contaminating the immersion fluid, other areas of resist, and/or parts of the lithographic apparatus in contact with the immersion fluid (e.g. the projection lens).

As a result of one or more of the problems mentioned above, the edge bead may be removed. Removal of the edge bead is commonly referred to as edge bead removal (EBR). The removal of the edge bead may be undertaken, for example, using one or more appropriate solvents.

It is common to provide the substrate with a number of layers other than the resist. For example, an anti-reflection coating may be applied to the substrate before the substrate is provided with a layer of resist. A top coat layer may be provided on top of the layer of resist to protect it from the immersion fluid and/or to serve as another anti-reflection layer. Edge bead removal may be performed for a layer deposited on the substrate.

When a plurality of layers is deposited on the substrate, it may be difficult to ensure that the removal of edge beads of certain layers does not inadvertently uncover portions of layers below. Inadvertent uncovering of a portion of a layer deposited on the substrate may leave the substrate vulnerable to contamination, or damage. Edge bead removal may be performed a number of times, once for each successfully deposited layer. Edge bead removal for these layers should be aligned so that portions of layers are not inadvertently uncovered.

It is desirable to use as much of the substrate area as possible for creating devices, both for reasons of cost and throughput. Due to tolerances of the machines and/or methods used to remove the edge bead of one or more layers deposited on the substrate, a maximum available area for creating such devices may be reduced, having a negative input on throughput and cost.

It is desirable to provide a substrate processing method and a device manufacturing method which may obviate or mitigate one or more of the problems identified herein or one or more other problems not identified herein.

According to an aspect of the present invention, there is provided a substrate processing method comprising, on a substrate provided with an anti-reflective coating which extends to or beyond a peripheral edge of the substrate:

removing a portion of the anti-reflective coating adjacent to and around a periphery of the substrate using a back-side removal process;

depositing a layer of radiation sensitive material onto the anti-reflective coating;

depositing a top-coat layer onto the layer of radiation sensitive material; and simultaneously removing a portion of the layer of radiation sensitive material and a portion of the top-coat layer from around an area adjacent to the periphery of the substrate using a top-side removal process.

According to another aspect of the present invention, there is provided a device manufacturing method, comprising, on a substrate provided with an anti-reflective coating which extends to or beyond a peripheral edge of the substrate:

removing a portion of the anti-reflective coating adjacent to and around a periphery of the substrate using a back-side removal process;

depositing a layer of radiation sensitive material onto the anti-reflective coating;

depositing a top-coat layer onto the layer of radiation sensitive material;

simultaneously removing a portion of the layer of radiation sensitive material and a portion of the top-coat layer from around an area adjacent to the periphery of the substrate using a top-side removal process; and exposing the layer of radiation sensitive material to a radiation beam in order to apply a pattern to the layer of radiation sensitive material, the pattern forming at least a part of a device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

Figure 1:
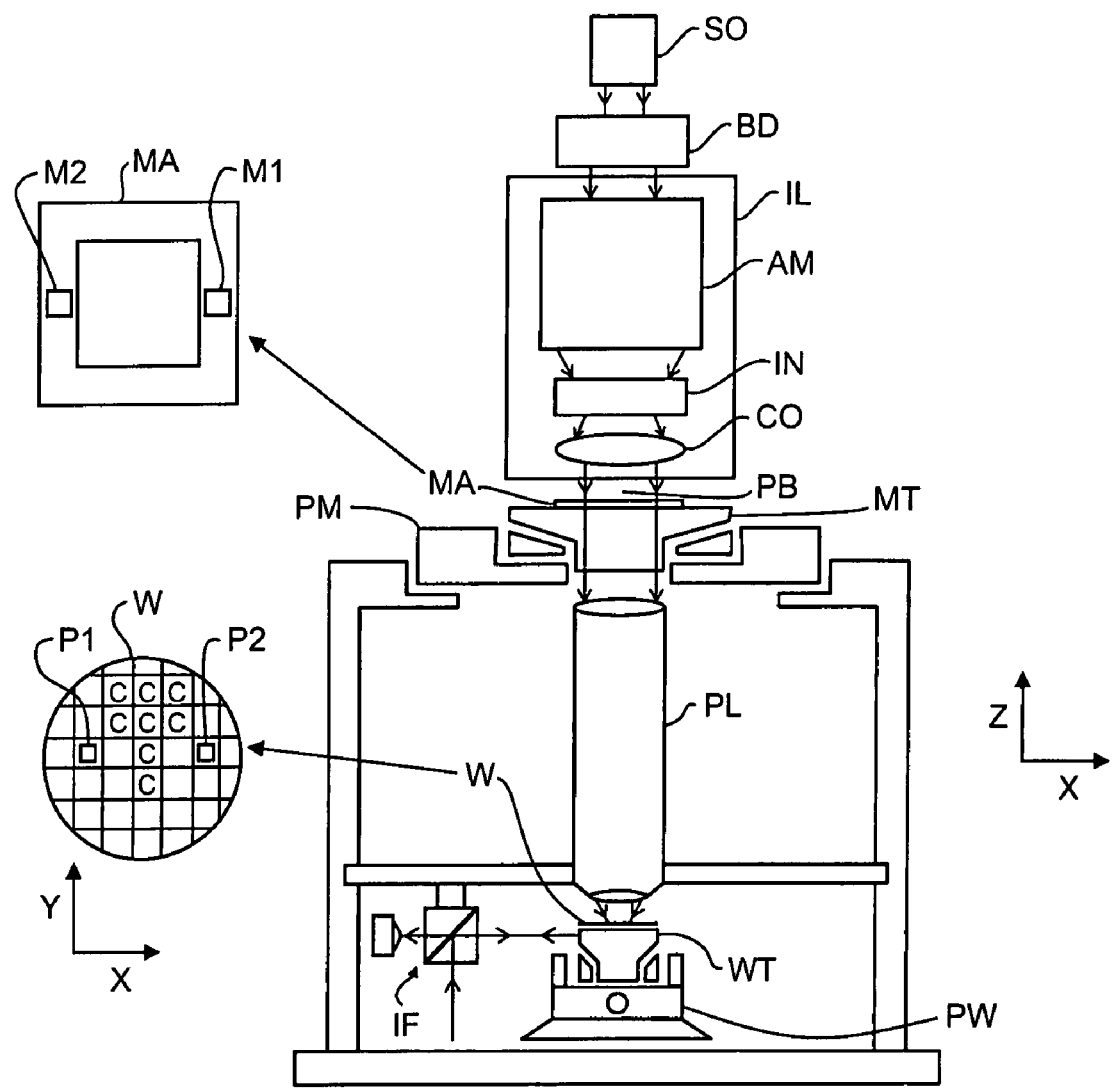
FIG. 1 depicts a lithographic apparatus.

FIG. 1 schematically depicts a lithographic apparatus. The apparatus comprises:

an illumination system (illuminator) IL to condition a beam PB of radiation (e.g. UV radiation);

a support structure (e.g. a mask table) MT to support a patterning device (e.g. a mask) MA and connected to first positioning device PM to accurately position the patterning device with respect to item PL;

a substrate table (e.g. a wafer table) WT for holding a substrate (e.g. a resist-coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The illumination system may also encompass various types of optical components, including refractive, reflective, and catadioptric optical components for directing, shaping, or controlling the beam of radiation, and such components may also be referred to below, collectively or singularly, as a "lens".

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
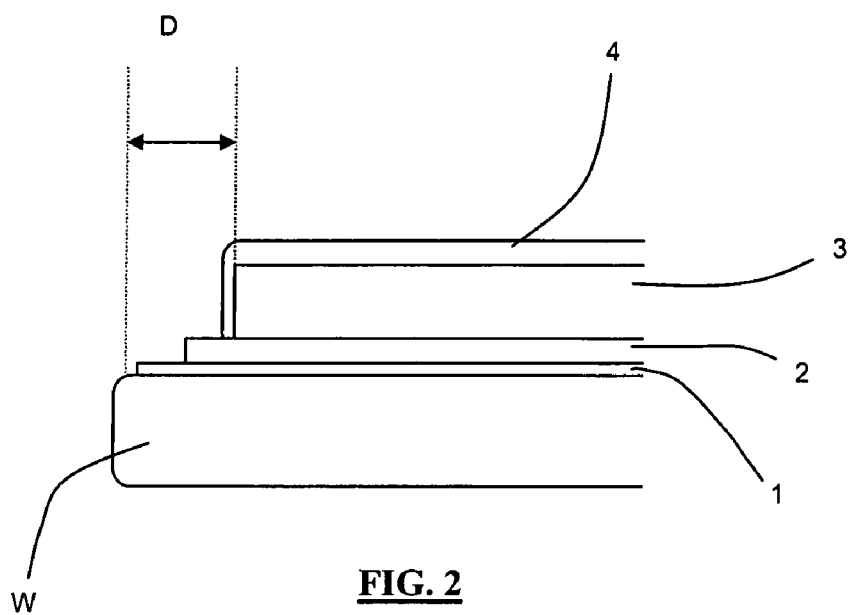
FIG. 2 depicts a stack of layers deposited on a substrate.

FIG. 2 depicts a stack of layers deposited on a substrate W according to a particular method. In accordance with that method, a HMDS (Hexamethyldisilizane) adhesion promotion layer 1 is deposited on the substrate in a known manner, for example, by vapor priming or by spin coating. The adhesion promotion layer 1 prevents resist from being deposited directly onto the substrate W, which could otherwise become easily removed and contaminate the lithographic apparatus. A BARC (bottom anti-reflective coating) layer 2 is then deposited on top of the adhesion promotion layer 1, again in a known manner, for example, by spin coating. An edge bead removal process is then undertaken on the BARC layer 2 to ensure that an area of the adhesion promotion layer 1 is free of BARC. The edge bead removal process is undertaken from the top-side of the substrate, that is, the side of the substrate onto which the stack of layers are deposited. The substrate W is then baked to stabilize the BARC layer 2.

The next step in the method is the deposition of a layer of resist 3 onto the BARC layer 2. A top-side edge bead removal process is then undertaken on the resist layer 3 to ensure that an area of the BARC layer 2 extending around the substrate W is free of resist. The substrate W is then baked to stabilize the resist layer 3. A top-coat layer 4 (e.g. a TARC layer, that is a top anti-reflective coating) is then deposited on top of the resist layer 3. The top-coat layer 4 extends across the resist layer 3, over the edges of the resist layer 3 and onto the BARC layer 2. The top-coat layer 4 may also extend on to the adhesion promotion layer 1. Since the top-coat layer 4 does not adhere well to, for example, a silicon substrate, ensuring that the top-coat layer 4 extends onto the adhesion layer 1 reduces or eliminates the risk of parts of the top-coat layer 4 becoming detached from the substrate W at later stages of the processing of the substrate W.

Once all the layers have been deposited on the substrate, a final top-side edge bead removal process is undertaken on the top-coat layer 4 to ensure that an area of the adhesion promotion layer 1 is free of the top-coat layer 4, and extends around the substrate W. The substrate W is then baked to stabilize the top-coat layer 4.

Layers are deposited on the substrate W using equipment known as coating modules (or other suitable equipment). Due to mechanical limitations in the equipment used, there is an inherent inaccuracy in the substrate centering which varies from substrate to substrate. This in turn leads to varying edge bead removal widths across a substrate, and between different substrates. Also or alternatively, one or more solvent dispensing nozzles used in the edge bead removal process may have inherent positional inaccuracies, resulting in a variation in the edge bead removal width. These hardware limitations may result in, amongst others, situations where the top-coat layer 4 is deposited on the substrate W, or where an edge portion of the resist layer 3 is not covered by the top-coat layer 4.

As a result of one or more of the hardware limitations mentioned above, various tolerances may have to be built into the deposition and/or edge bead removal processes to ensure that the resulting stack of layers is satisfactorily positioned and processed. Such tolerances may result in a substrate W having a resist layer 3 which extends to within a minimum distance D of 2.2 mm from the edge of the substrate W.

It is desirable to reduce the distance between the edge of the substrate W and the edge of the resist layer 3 in order to maximize the available area of resist that can be patterned to create devices (and the like). Not only could this increase the throughput of devices that can be created, but it could reduce costs in that more devices can be made on a single substrate.

FIGS. 3 to 10 illustrate a lithographic method which can be used to increase the available area of resist and to ensure that the top-coat layer is well aligned with the resist layer. In these Figures, the features referred to previously are given the same reference numerals. The Figures are not drawn to scale, and in some cases the scale may be deliberately exaggerated to increase the clarity of certain features of those Figures.

Figure 3:
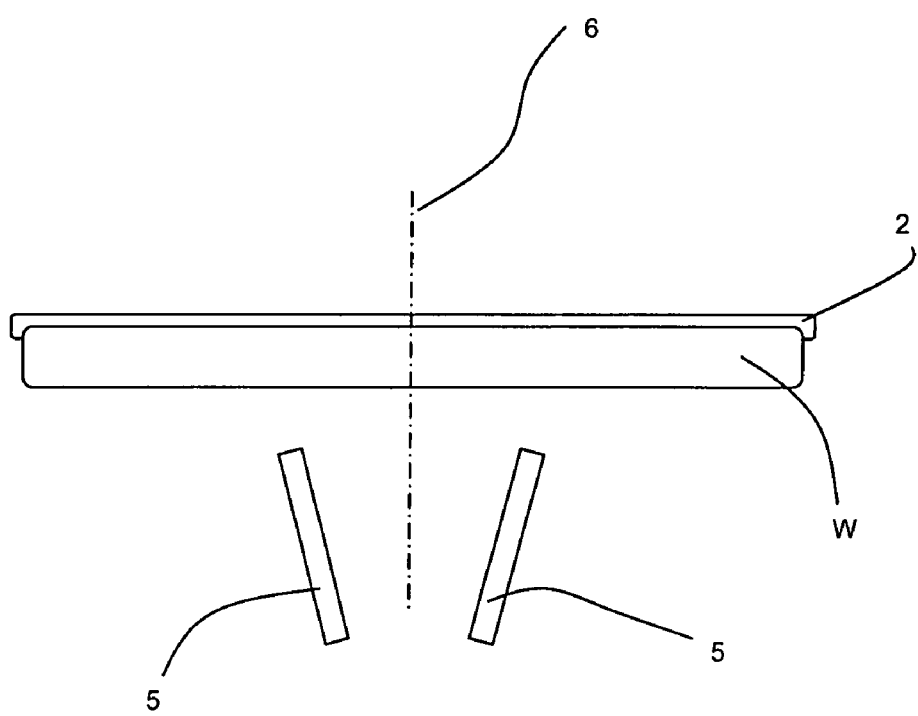
FIG. 3 depicts an apparatus for use in back-side edge bead removal process.

FIG. 3 depicts a substrate W provided with a BARC layer 2 extending across the surface of the substrate and slightly over its peripheral edge. Two nozzles 5 are directed towards the back-side of the substrate W (that is, the opposite side to which layers of resist, etc. are deposited on). The substrate W is rotatable about a central axis 6. The axis 6 is not a structural feature, but is instead given as a point of reference about which rotation of the substrate W may be described.

Figure 4:
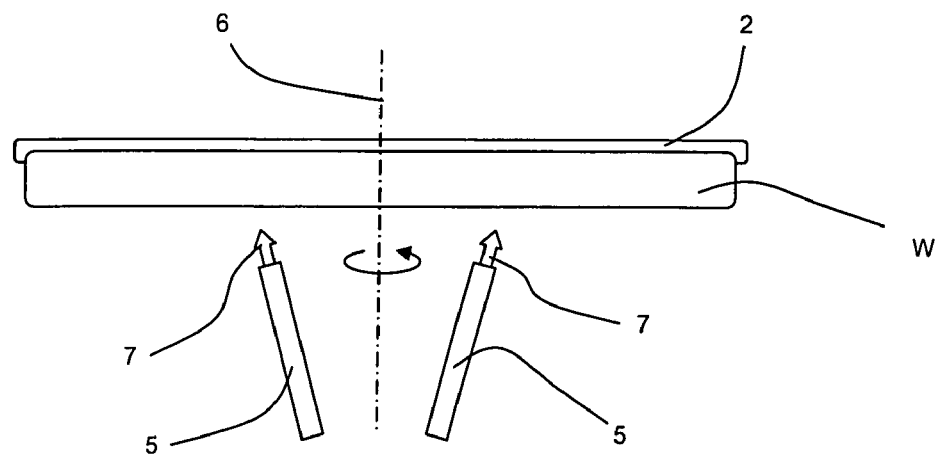
FIGS. 4 and 5 depict a back-side edge bead removal process.
Figure 5:
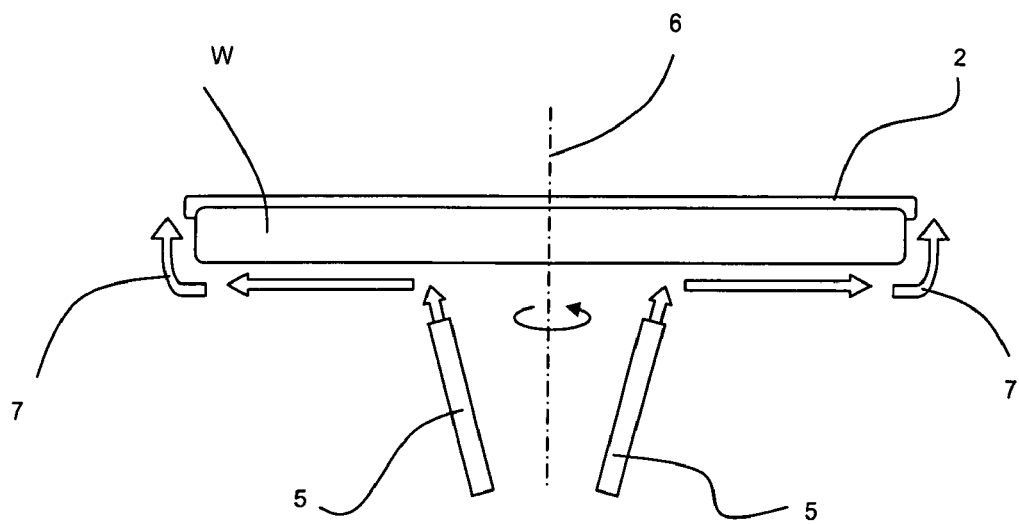

FIG. 4 shows that solvent 7 is ejected from each of the nozzles 5, and directed towards the back-side of the substrate W. At the same time, the substrate W is rotated about central axis 6. FIG. 5 shows what happens to the solvent 7 when it is incident upon the back-side of the substrate W. It can be seen that as the substrate W is rotated the solvent moves towards the outer edge of its back-side. Furthermore, it can also be seen that the solvent 7 creeps around the peripheral edge of the substrate (which may include one or more bevels and/or apexes). By accurately deciding upon and controlling the speed of rotation of the substrate, one can control how far the solvent 7, applied to the back-side of the substrate W, creeps around the edge and extends radially inwardly on the top-side of the substrate W. Thus it will be appreciated that this process can be used to clean the back-side of the substrate W, the edge of the substrate W, and, if desirable, to provide a clean edge extending around the top-side of the substrate W. By carefully controlling the rotational speed, the solvent can be made to just creep to the interface between the top-side of the substrate W and its edge. That is, the solvent can be used to clean the back and edges of the substrate, while not removing any of the BARC layer from the top-side of the substrate. The process can be such that there is no gap between the BARC layer on the top-side of the substrate and the periphery of the substrate, or to create a gap equal to or less than 0.5 mm, 1.0 mm or 2 mm.

Figure 6:
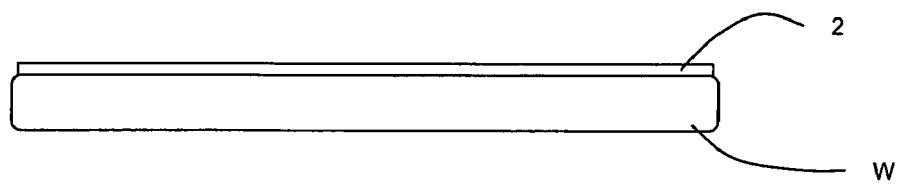
FIG. 6 depicts a substrate provided with a layer that has had its edge bead removed using the process depicted in FIGS. 4 and 5.

FIG. 6 illustrates the situation where the rotational speed on the substrate W has been controlled such that a BARC layer 2 is only left on the top-side of the substrate W. It can be seen that the BARC layer 2 extends across the entire surface of the substrate W but not over its edges. This means that, in any further processing steps, any layer deposited on top of the BARC layer 2 does not come into contact with the top-side of a substrate W, since the BARC layer 2 extends across the entire surface of the top-side of the substrate W. This means that the IDS adhesion promotion layer (described in relation to FIG. 2) is not required using the method according to an embodiment of the present invention. Since such an HMDS layer is not required, the time and resources that would otherwise have been used to deposit such a layer on the substrate are no longer needed, reducing processing time and the costs.

Figure 7:
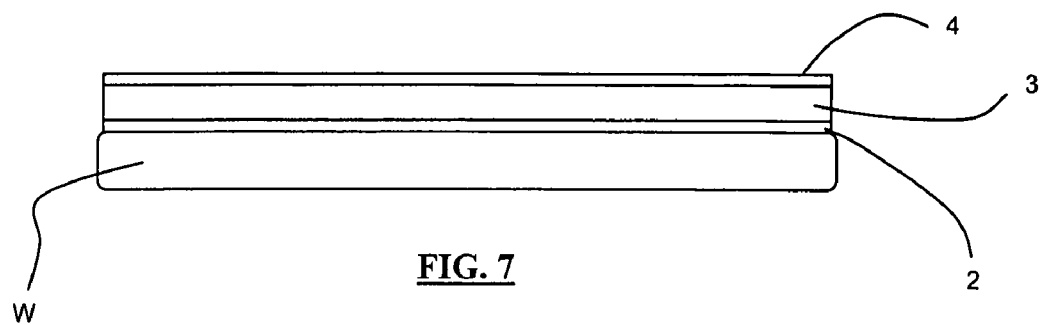
FIG. 7 depicts the substrate of FIG. 6 provided with two additional layers.

After the BARC layer has been removed from the back-side and edges of the substrate W, a soft-baking at a temperature between 160° C. and 220° C. is performed to stabilize the BARC layer 2 on the top-side of the substrate W. Soft-baking is well known, and so will not be described in detail here. After the soft-baking, a layer of resist 3 is deposited onto the BARC layer 2 using, for example, a spin-coating process. A soft-baking at a temperature between 90° C. and 150° C. is performed to stabilize the resist layer 2 on the top-side of the substrate W. A top-coat layer 4 is deposited on top of the resist layer 3 using, for example, a soft-baking performed at a temperature between 80° C. and 110° C. The top-coat layer 4 may be provided to protect the resist from an immersion fluid and/or to serve another purpose, for example as an anti-reflective coating. The resulting stack of layers is shown in FIG. 7.

As discussed earlier, the deposition of the resist layer 3 and top-coat layer 4 may cause an edge bead to form at the outer edges of each respective layer. This edge bead should be removed to ensure that material forming the edge bead cannot become dislodged during processing of the substrate, since the dislodged material may contaminate the immersion fluid or a part of the lithographic apparatus used to process the substrate.

Figure 8:
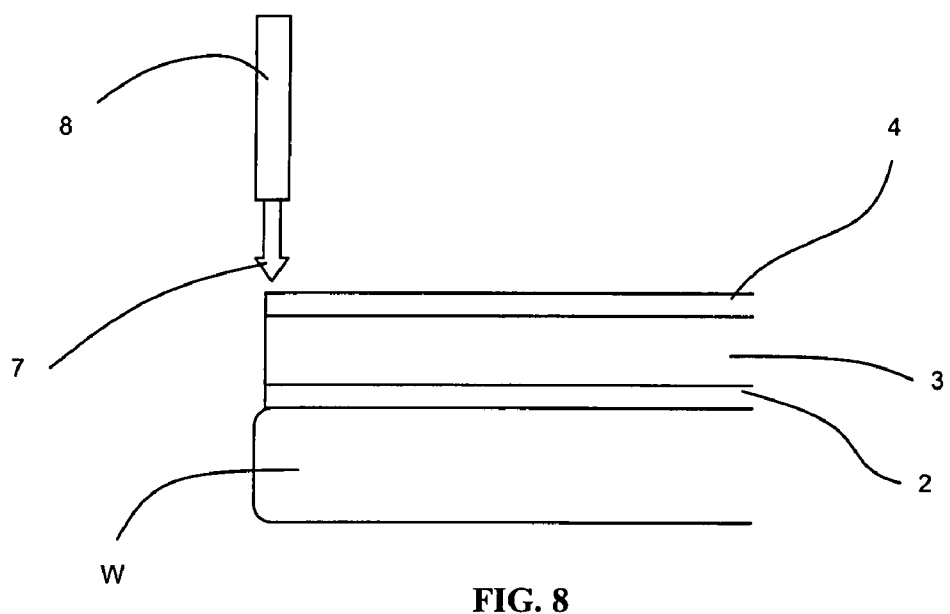
FIG. 8 depicts the simultaneous removal of the edge beads of the two additional layers shown in FIG. 7 using a top-side edge bead removal process.
Figure 9:
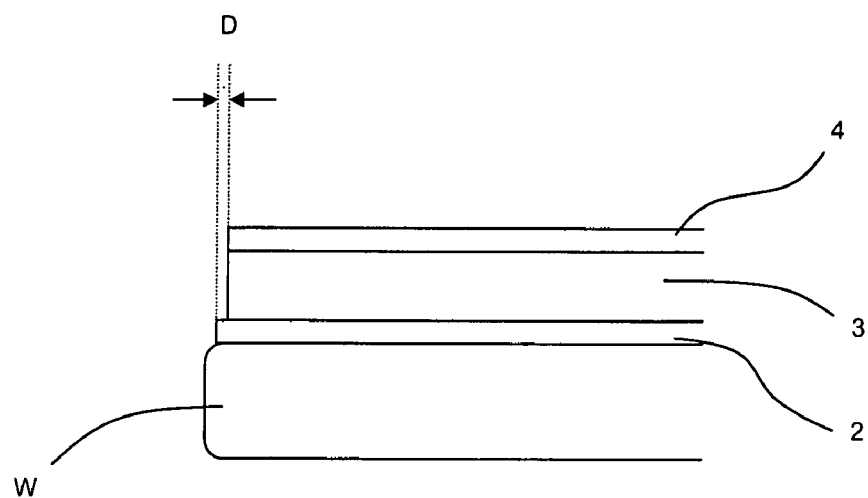
FIG. 9 depicts the substrate of FIG. 7 after the edge bead of each additional layer has been removed using the process depicted in FIG. 8.

FIG. 8 shows how the edge bead of the top-coat layer 4 and resist layer 3 may be removed simultaneously. A top-side edge bead removal process is shown wherein a nozzle 8 is disposed adjacent to the top-side of the substrate W. The nozzle 8 is oriented to direct solvent 7 onto a peripheral edge of the substrate W and thus resist layer 3 and top-coat layer 4. The substrate W may be rotated to ensure that the edge-bead of the resist layer 3 and top-coat layer 4 may be removed from around the periphery of the substrate W.

Because a simultaneous edge bead removal process is undertaken to remove the edge bead of both the top-coat layer 4 and resist layer 3, fewer processing steps may be required. This could reduce costs and increase throughput. Furthermore, since only a single top-side edge bead removal process is used, there is no need to take into account or introduce tolerances for multiple edge bead removal processes. Since a single top-side edge bead removal process is used, the overall accuracy of the edge bead removal process may be increased meaning that, when completed, the resist layer 3 extends nearer to the edge of the substrate W than it would using other techniques. Thus, the area available for patterning and therefore the creation of, for example, devices may be increased. For example, it can be seen from FIG. 9 that the distance D between the edge of the substrate and the edge of the layer of resist 3 when its edge bead has been removed may be, for example, less than 2.2 mm, less than 2.0 mm, less than 1.0 mm or less than 0.5 mm. This is in stark contrast to the situation using one or more prior methods, where, as described above, this distance is 2.2 mm or more. It can also be seen that, since the edge beads of the top-coat layer 4 and resist layer 3 are removed simultaneously, the outer edges of the top-coat layer 4 and resist layer 3 are aligned with one another. That is, using the method according to an embodiment of the present invention, the top-coat layer 4 completely covers the resist layer 3, and with greater reliability and accuracy, and in fewer steps, than in one or more prior methods.

Figure 10:
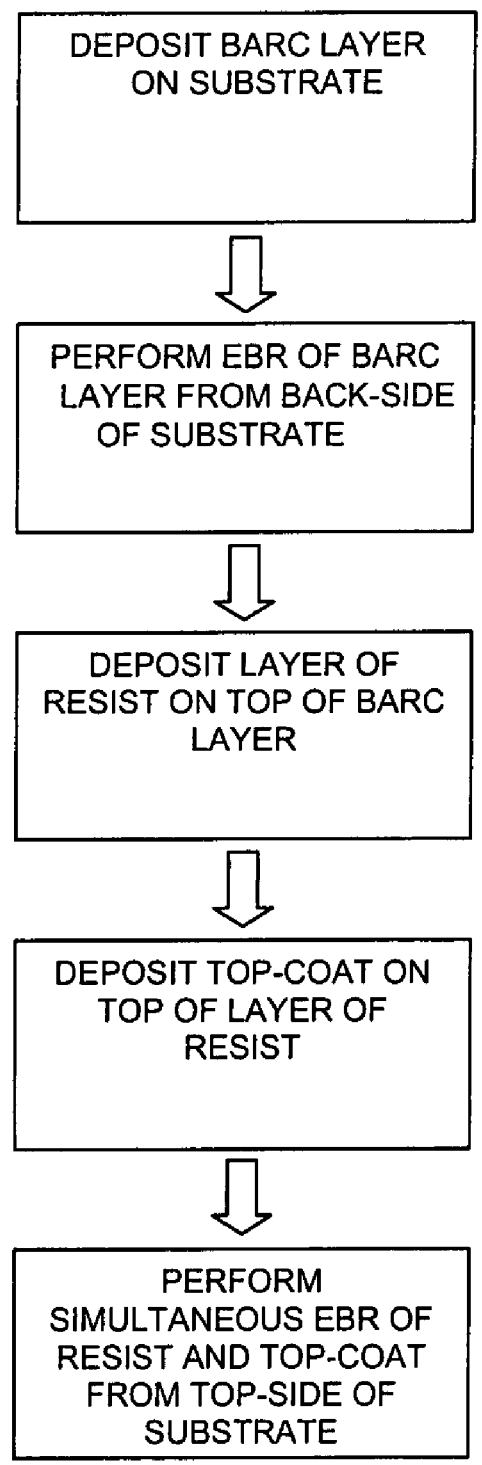
FIG. 10 depicts a flow scheme of a process of conditioning an edge of a stack of layers on a substrate in accordance with an embodiment of the invention.

FIG. 10 summarizes, in general, the back-side and simultaneous top-side edge bead removal processes undertaken on layers deposited on the substrate.

In the embodiments described above, a first BARC layer is shown as being deposited onto (or already provided on) the substrate. A second BARC layer may be deposited onto (or already provided on) the substrate prior to the back-side edge bead removal process. The first BARC layer may be different from the second BARC layer.

In the embodiments described above, the removal of edge beads of layers has been described. The edge beads have been described as being removed using top-side or back-side edge bead removal processes. These edge-bead removal processes involve removing parts of the respective layer which form the edge bead. It will be appreciated, however, that the removal of parts of the respective layers may not involve removing edge beads but, for example, a flat (or otherwise) portion of the layer. For example, it may be desirable to provide a top-coat and resist free region on the BARC layer around the edge of the substrate, or to provide a BARC, resist and top-coat free region extending around the substrate. One or more of the methods described herein may be used to remove parts of the BARC layer from the back-side, peripheral edges or faces, and top-side of the substrate, as well as removing portions of the resist and top-coat layers around a region adjacent to and extending around the periphery of the substrate. Such method(s) may still maximize, for example, the area of resist available for patterning (as described above).

In the embodiments described above, reference has been made to immersion lithography. This is not essential, and the method is applicable to substrates processed for use in other ways. For example, instead of a BARC layer, any appropriate first layer could be used. For example, an adhesion promotion layer could be used. Instead of a resist layer and a top-coat layer, any suitable second and third layers may respectively be used. For example, the third layer may be a seal or the like. A substrate may be provided which has already been provided with a first layer that extends to its edge (e.g. it may not be necessary to undertake a back-side edge bead removal process), for example less than 2.0 mm, less than 1.5 mm, less than 1.0 mm, less than 0.5 mm or 0 mm from its edge. One or more embodiments of the present invention are, however, particularly suited to substrates for use in immersion lithography, since a stack of three layers deposited on such substrates is often used.

While specific embodiments of the invention have been described above, it will be appreciated that the invention may be practiced otherwise than as described. The description is not intended to limit the invention.

The invention claimed is:

1. A substrate processing method comprising, on a substrate provided with an anti-reflective coating, on a top-side of the substrate, which extends to or beyond a peripheral edge of the substrate:
   removing a portion of the anti-reflective coating on the top-side of the substrate and/or on a periphery of the substrate using a removal process acting from a back-side of the substrate opposite to the top-side of the substrate;
   depositing a layer of radiation sensitive material onto the anti-reflective coating;
   depositing a top-coat layer onto the layer of radiation sensitive material; and
   simultaneously removing a portion of the layer of radiation sensitive material and a portion of the top-coat layer from around an area adjacent to the periphery of the substrate using a removal process acting from the top-side of the substrate.

2. The method of claim 1, wherein removing a portion of the anti-reflective coating involves removing an edge bead of the anti-reflective coating.

3. The method of claim 1, wherein removing a portion of the radiation sensitive material layer involves removing an edge bead of the radiation sensitive material layer.

4. The method of claim 1, wherein removing a portion of the top-coat layer involves removing an edge bead of the top-coat layer.

5. The method of claim 1, wherein removing a portion of the anti-reflective coating involves removing a portion of the anti-reflective coating from a back-side of the substrate.

6. The method of claim 1, wherein removing a portion of the anti-reflective coating involves removing a portion of the anti-reflective coating from a peripheral edge or face of the substrate.

7. The method of claim 1, wherein removing a portion of the anti-reflective coating involves removing a portion of the anti-reflective coating from a top-side of the substrate.

8. The method of claim 1, wherein the anti-reflective coating extends to within less than 2.0 mm of the periphery of the substrate.

9. The method of claim 1, wherein the anti-reflective coating extends to within less than 1.0 mm of the periphery of the substrate.

10. The method of claim 1, wherein the anti-reflective coating extends to within less than 0.5 mm of the periphery of the substrate.

11. The method of claim 1, wherein the layer of radiation sensitive material extends to within less than 2.2 mm of the periphery of the substrate.

12. The method of claim 1, wherein the layer of radiation sensitive material extends to within less than 2.0 mm of the periphery of the substrate.

13. The method of claim 1, wherein the layer of radiation sensitive material extends to within less than 1.0 mm of the periphery of the substrate.

14. The method of claim 1, wherein the layer of radiation sensitive material extends to within less than 0.5 mm of the periphery of the substrate.

15. The method of claim 1, wherein the radiation sensitive material is a photo resist.

16. The method of claim 1, further comprising exposing at least a part of the layer of radiation sensitive material to a radiation beam in order to apply a pattern to the layer of radiation sensitive material.

17. The method of claim 1, wherein the layer of radiation sensitive material is exposed to a radiation beam via an immersion fluid.

18. The method of claim 1, wherein the top-coat is substantially insoluble in an immersion fluid.

19. The method of claim 1, wherein the top-coat is substantially transparent to a wavelength of a radiation beam.

20. The method of claim 1, wherein the top-coat layer is an anti-reflective coating.

21. A device manufacturing method, comprising, on a substrate provided with an anti-reflective coating, on a top-side of the substrate, which extends to or beyond a peripheral edge of the substrate:
   removing a portion of the anti-reflective coating on the top-side of the substrate and/or on a periphery of the substrate using a removal process acting from a back-side of the substrate opposite to the top-side of the substrate;
   depositing a layer of radiation sensitive material onto the anti-reflective coating;
   depositing a top-coat layer onto the layer of radiation sensitive material;

simultaneously removing a portion of the layer of radiation sensitive material and a portion of the top-coat layer from around an area adjacent to the periphery of the substrate using a removal process acting from the topside of the substrate; and exposing the layer of radiation sensitive material to a radiation beam in order to apply a pattern to the layer of radiation sensitive material, the pattern forming at least a part of a device.

22. The method of claim 21, wherein the layer of radiation sensitive material is exposed to the radiation beam via an immersion fluid.

* * * * *